United States Patent [19]
Lum

[11] Patent Number: 5,707,881
[45] Date of Patent: Jan. 13, 1998

[54] TEST STRUCTURE AND METHOD FOR PERFORMING BURN-IN TESTING OF A SEMICONDUCTOR PRODUCT WAFER

[75] Inventor: Thomas Francis Lum, Austin, Tex.

[73] Assignee: Motorola, Inc., Schaumburg, Ill.

[21] Appl. No.: 706,888

[22] Filed: Sep. 3, 1996

[51] Int. Cl.$^6$ ............................................. H01L 21/66
[52] U.S. Cl. ................................ 437/8; 437/211; 437/226
[58] Field of Search ........................... 437/7, 8, 51, 211, 437/226; 148/DIG. 162

[56] References Cited

U.S. PATENT DOCUMENTS

| | | | |
|---|---|---|---|
| 5,140,405 | 8/1992 | King et al. | 257/727 |
| 5,397,997 | 3/1995 | Tuckerman et al. | 324/754 |
| 5,399,505 | 3/1995 | Dasse et al. | 437/8 |
| 5,483,741 | 1/1996 | Akram et al. | 437/8 |
| 5,489,538 | 2/1996 | Rostoker et al. | 437/226 |
| 5,495,667 | 3/1996 | Farnworth et al. | 437/8 |
| 5,532,174 | 7/1996 | Corrigan | 437/226 |

*Primary Examiner*—Chandra Chaudhari
*Attorney, Agent, or Firm*—Keith E. Witek

[57] ABSTRACT

A test structure and test methodology are taught herein wherein a test structure (10) is used to test an entire integrated circuit product wafer (44). The test structure (10) has a backing support wafer (39). A die attach compound (38) is used to attach a plurality of segmented individual test integrated circuits 28–34 to the backing support wafer (39). The plurality of test integrated circuits 28–34 have a top conductive bump layer (26). This conductive bump layer (26) is contacted to a thin film signal distribution layer (14) which contains conductive interconnects, conductive layers, and dielectric layers which route electrical signals as illustrated in FIG. 2. The layer 14 also conductively connects to bumps (46) on a product wafer (44). In addition, leads (40) are coupled to conductive elements of the layer (14). An external tester is coupled via leads (40) to the integrated circuits (28) and (34) whereby the integrated circuits (28–34) burn-in or test integrated circuits on the product wafer (44) in an efficient and effective manner.

37 Claims, 6 Drawing Sheets

TEST STRUCTURE AND METHOD FOR PERFORMING BURN-IN TESTING OF A SEMICONDUCTOR PRODUCT WAFER

CROSS REFERENCE TO RELATED APPLICATIONS

The present application is related to the following U.S. patent applications:

"An Apparatus, Method, and Wafer Used for Testing Integrated Circuits Formed on a Product Wafer", invented by Robert K. DeHaven, et al., Attorney Docket No. SC-02432A, Ser. No. 08/606,631, filed Feb. 26, 1996 and assigned to the assignee hereof.

1. Field of the Invention

The present invention relates generally to semiconductor product testing, and more particularly, to wafer-level burn-in of semiconductor wafers using a wafer level test apparatus and methodology.

2. Background of the Invention

In the integrated circuit industry, it is important that integrated circuits be tested in order to ensure that functional integrated circuits are being shipped to customers. Integrated circuits are formed in fabrication facilities by making hundreds to thousands of integrated circuits on a single integrated circuit wafer. Currently, these integrated circuits are diced or cut from the semiconductor wafer and packaged in integrated circuit packages. After being packaged, the integrated circuits are subjected to functional testing and burn-in operations to ensure that each packaged integrated circuit is functioning properly and reliably. A problem with this process is that all of the integrated circuits on the semiconductor wafer that are diced and packaged may not be functioning after final testing. These non-functioning integrated circuits on the wafer are none the less packaged and tested along with functioning integrated circuits on the wafer, incurring additional wasted cost and manufacturing time. It would be advantageous to determine at a wafer level which integrated circuits are functional and non-functional before the time and cost of integrated circuit packaging is incurred.

One method for performing wafer level testing to save time and packaging costs is to form sacrificial wafer level conductive layers on top of the product wafers. These sacrificial test conductive layers are then used to burn-in and test all integrated circuits on an entire wafer prior to dicing or cutting the integrated circuits from the wafer. By performing this wafer level test, integrated circuits which are non-functional can be flagged early in the process and can be discarded without incurring the cost and additional time of the packaging operation.

However, the formation of sacrificial wafer level test layers on top of a product wafer may not be an optimal process. These additional layers added to the top of a product wafer add process complexity to the manufacture of the product wafers. Therefore, these sacrificial wafers reduce the yield of the product wafer in an unnecessary fashion. Furthermore, the manufacture of semiconductor wafers is performed in the clean room which is substantially free of contamination. On the other hand, testing of the entire wafer is performed in an environment that is substantially unclean. Therefore, once the test operation has been performed in an unclean environment the wafer must be transferred back into a clean environment to perform removal of the sacrificial wafer level test layer. This process of bringing a wafer from a contaminated area into a clean area may result in the clean area ultimately being contaminated whereby other wafers being manufactured in the clean area are going to be impacted in terms of yield.

In addition, the deposition of sacrificial metallic layers on a wafer level scale does not allow one to perform intelligent testing of an integrated circuit. Most of the testing performed by this wafer scale sacrificial deposition is serial in nature and is not intelligent in terms of activity circuitry.

Therefore, a need exists for a better method to test integrated circuits on a wafer scale level. This method should maintain the advantages of reducing packaging time and cost for inoperative die while at the same time not damaging or hindering yield of a product wafer.

BRIEF DESCRIPTION OF THE DRAWINGS

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a test structure and methodology for testing an entire semiconductor wafer where the semiconductor wafer contains a plurality of product integrated circuits. The test apparatus has a base layer which typically comprises a silicon wafer mold upon which is formed a thin film signal distribution layer. The signal distribution layer contains: (1) one or more levels of metal to route electrical signals; (2) optional interconnects and contacts as needed between metal layers of the thin film signal distribution layer; (3) and dielectric encapsulation as needed to provide electric isolation for (1) and (2). Conductive contact areas are located on a top and bottom surface of the thin film signal distribution layer so that electrical signals can be sent between the top surface of thin film signal distribution layer and the bottom surface of the thin film signal distribution layer. A plurality of test integrated circuits are placed onto the thin film signal distribution layer so that conductive bumps on a top surface of the plurality of test integrated circuits are electrically coupled to the contact areas located on a top surface of the thin film signal distribution layer. The plurality of test integrated circuits are stabilized and mechanically strengthened by a silicon backing wafer attached to backsides of the plurality of test integrated circuits.

Product wafers are coupled one at time to the plurality of test integrated through the conductive elements of the thin film signal layer. The product integrated circuits of the product wafers are tested via power, ground, and other optional electrical signals communicated from the plurality of test integrated circuits the product wafer through the thin film signal distribution layer. This process allows engineers to identify known good die while in wafer form where the known good die can be segregated from "bad" die for further manufacturing processes. This wafer level known good die technique prevents inoperative "bad" die from being further processed. The identification of known good die, before dicing the integrated circuits from the wafer, saves packaging time, increases good die throughput, and reduces wasted manufacturing costs. In addition, this wafer level test mechanism significantly aids in the manufacture of multi-chip-modules (MCM) by eliminating inoperative die from subsequent processing.

The invention can be understood with reference to FIGS. 1-11.

The present invention is a method and apparatus used to perform wafer level burn-in. The method and apparatus use a wafer-level test structure assembled from individually-tested and singulated test die. Note that the present invention is applicable to more than wafer burn-in and includes any integrated circuit testing, functional and parametric test, static burn-in testing, and dynamic burn-in testing. The method for fabricating the test structure for use in wafer level burn-in/test is illustrated in FIGS. 1-7.

Figure 1:
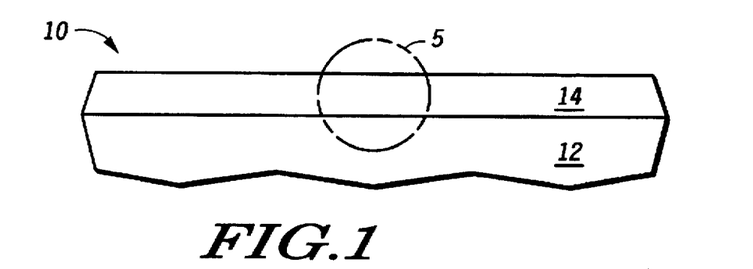
FIGS. 1-7 illustrate, in a cross-sectional diagram, a process which is used to form a wafer level test structure in accordance with the present invention.

Referring to FIG. 1, a signal distribution film 14 is built on top of a mold 12. Mold 12 is preferably a blank silicon wafer of the same size as the wafer which is to subsequently undergo burn-in/testing. The test 10 taught herein can be designed to accommodate any wafer size (e.g. 5", 6", 8", 12", etc.). The wafer mold 12 is used to provide mechanical support on which the thin film 14 can be formed without damage. Using the wafer 12 also allows layer 14 to be formed in a cost effective manner with high yield by using many conventional integrated circuit (IC) processing steps.

Therefore, the layer 14 is formed on top of the mold 12 using conventional integrated circuits (IC) processing and materials, such as polyimide, silicon dioxide, copper, aluminum, silicides, BPSG, PSG, polysilicon, etc.. Specifically, the layer 14 is manufactured using conventional film deposition, lithographic processing, and etching using the mold 12 as a temporary substrate. An example of layer 14 is illustrated in a magnified portion 5 of FIG. 2, which is also illustrated in a non-magnified manner in FIG. 1.

Figure 2:
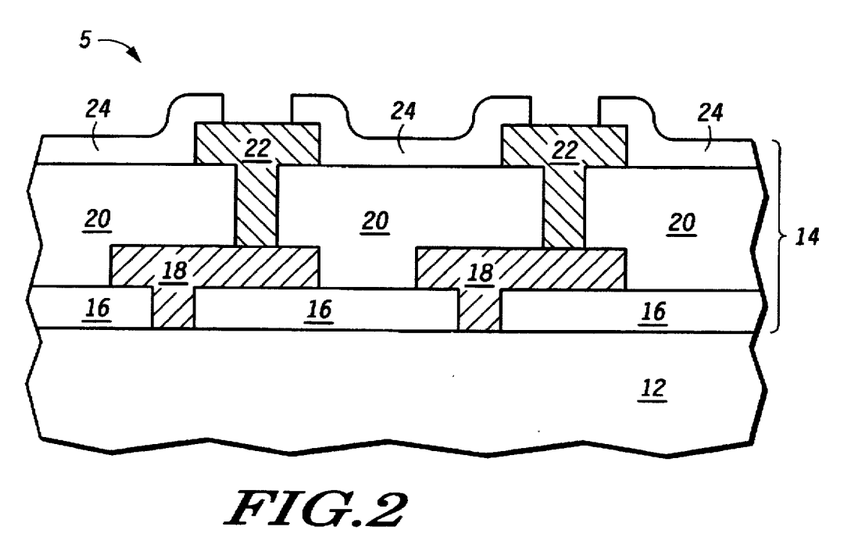

Referring to FIG. 2 which contains a magnified portion of FIG. 1, one possible embodiment for layer 14 is illustrated. In FIG. 2, a photo-imageable polyimide layer 16 is spun on the silicon mold wafer 12 to begin formation of the signal distribution film 14. Openings are then patterned through the layer 16 as illustrated in FIG. 2. The openings in layer 16 are formed to match a C4 conductive bump pattern or a subset C4 pattern of a product wafer 44 containing product integrated circuits (illustrated in FIG. 8). The polyimide layer is developed resulting in dielectric layer 16 which has openings as illustrated in FIG. 2. It should be noted that other technology other that C4 bump processing may be used herein.

A copper layer, or like metallic material 18, is then deposited over the mold 12 and the layer 16. Layer 18 will be used to form a first patterned metal conductive layer 18. It is important to note that some metallic layers taught herein will be exposed to solder processing in order to couple to C4 bumps, leads, or the conductive elements. The layers exposed to solder processing should be copper or a like metallic material to which solder can adequately adhere. Conductive layer 18 is therefore a first layer of metal which forms conductive interconnections and conductive contacts as illustrated in FIG. 2. Conductive contact of layer 18 are areas of layer 18 which fill the openings in layer 16 within FIG. 2. If a single metal thin film 14 is desired, processing can stop here with an optional dielectric capping layer on top of layer 18.

Figure 8:
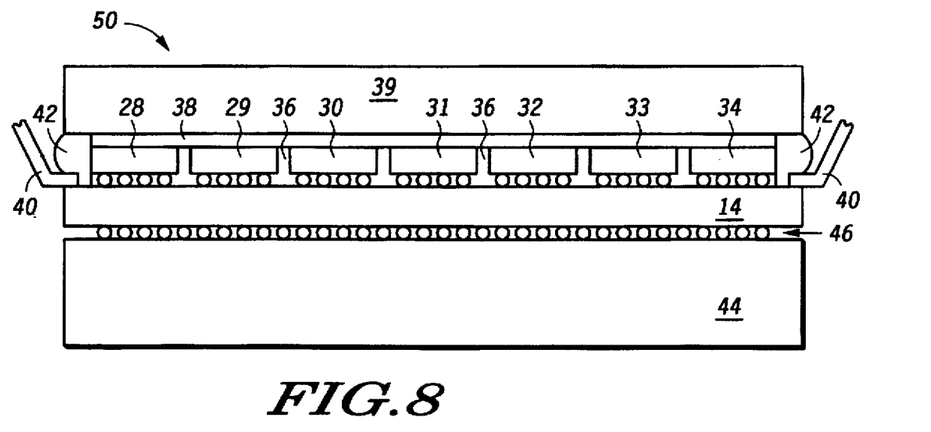
FIG. 8 illustrates, in a cross-sectional diagram, the test structure of FIG. 7 coupled to a product wafer so that burn-in operation can be performed on the product wafer in accordance with the present invention.

If a multi-metal-level structure is desired (single metal structures for layer 14 may not suffice in some applications), then further processing iterations may be performed to build further upon test structure 10 in FIG. 2. This further processing optionally forms the additional layer of dielectric portions 20, conductive layer 22, and optional passivation layer 24 to build the desired multi-level metal structure. In one embodiment of the present invention, passivation layer 24 is acts as a solder mask to define the area of solder wetting. As be seen, subsequent optional C4 bump underfill may reduce the need for a final passivation layer 24 in some embodiments. As illustrated in FIG. 2 conductive portions 22 will form contacts for connections to a test integrated circuits as illustrated in subsequent FIG. 3. As illustrated in FIG. 8, the layer 18 will contact to the C4 bump pattern of a product wafer 44 (remember that the mold 12 is a temporary support structure).

Optional passivation layer 24 completes formation of the signal distribution layer 14. The dielectric layers 16, 20, and 24 of FIG. 2 are used to prevent inadvertent electrical short circuits when testing product wafers. Note that alternate embodiments may incorporate any number of layers of dielectric and metal to form layer 14. Typically metal portions 18 and 22 would be copper but other metals, semiconductors, and the like may be incorporated into the layer 14 as conductive members. Collectively, dielectric portions 16, 20 and 24 and conductive portions 18 and 22 form signal distribution film 14.

It is important to note that in alternative embodiments, "smart", "active", and/or "passive" circuits may formed within the film 14. The easiest structures to form within film 14 are "passive" circuit elements. Passive circuit elements are diodes, resistors, capacitors, inductors, and the like. These devices can be used to form isolation, restrict current flow, divide voltages, decouple noise, etc.. For example, a parallel plate capacitor can be made with a first electrode in layer 22 and a second electrode in layer 18. Resistors can be made by depositing polysilicon between layers 18 and 22, etc.. In other forms, smart circuits like D flip-flops, multiplexers, transistors, logic gates, and the like, can be formed in silicon on insulator (SOI) substrates 12 and coupled to perform test functions within the test structure 10. Polysilicon layers can be deposited onto mold 12 to form thin film transistors (TFTs) which can perform switching functions. Anything that is possible for conventional IC formation is possible for the thin film 14.

Figure 3:
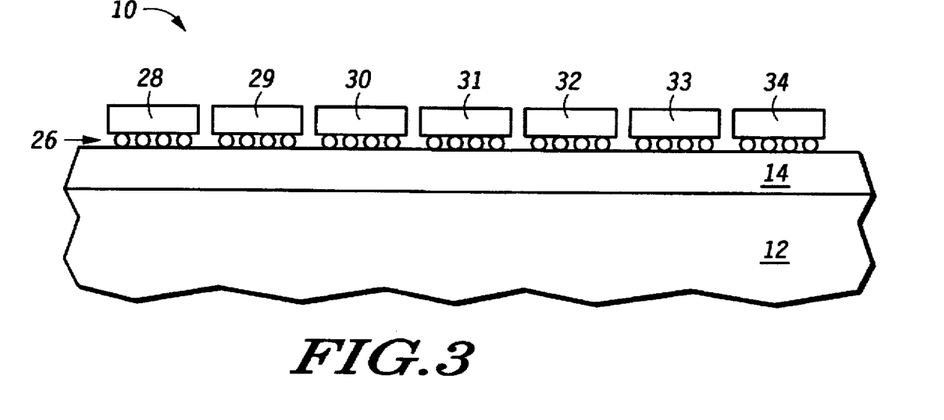

FIG. 3 illustrates further steps in the fabrication of test structure 10 where individual "good" test die 28-34 are attached to signal distribution film 14. "Good" means that the die 28-34 have been tested to a significant extent and determined to be fully operational. Note that individual good test die 28-34 are exemplary of a plurality of individual good test die incorporated in test structure 10. Anywhere from a few to hundreds/thousands of test die 28-34 can be arranged over the two dimensional surface of the mold 12 and film 14 (see FIG. 9). Die 28-34 are used for power control, current control, signal stimulus and generation for programmed control of burn-in testing, speed path testing, (JTAG) testing, Built In Self Test (BIST) testing, stuck-at-fault testing, and like test and monitored burn-in procedures/control. Each integrated circuit in die 28-34 may either be the same functional die or different die which perform different functions in the test system. in one example, each die 28-34 can be a microcontroller or ASIC responsible for test product integrated circuits and communicating test information between an external tester and the product ICs.

In one embodiment of the present invention good die 28-34 are attached to signal distribution film 14 using standard C4 conductive bumps 26 which are formed using standard C4 bump processing or like bump processes. There are a variety of alternative conductive contact methods, such as Elasticon™ connections, conductive tape, and the like. Conductive contact areas (illustrated as bumps 26 in FIG. 3) on each of the good die 28-34 are in contact with conductive areas 22 as illustrated in FIG. 2. This contact is typically made permanent by solder or like procedures. The contact between conductive contact areas on die 28-34 helps to maintain the mechanical integrity and alignment between good die 28-34 and conductive materials 18 from FIG. 2. In a preferred form, the materials used to manufacture the layer 14 should be similar to the materials used to form the integrated circuits of good die 28-34 in terms of thermal coefficient of expansion so that stress, alignment, temperature variation, etc., are not problems within the overall test structure 10.

Figure 4:
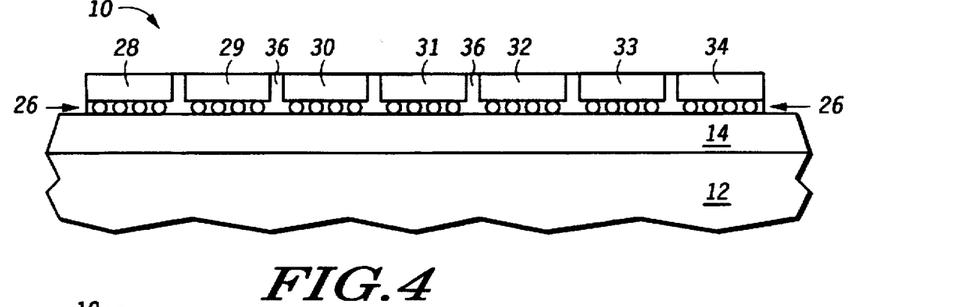

In FIG. 4, optional under fill material 36 is applied between good die 28-34 and signal distribution film 14. Typically, under fill material is applied in the spaces between good die 28-34 where this material 36 fills gaps located between the conductive bump contact areas. This filling phenomenon is performed by capillary action. In another embodiment than that illustrated in FIG. 3, it is advantageous to limit the under-fill material to the gaps between adjacent integrated circuits 28-34 while preventing the gaps between C4 bumps 26 in FIG. 4 from being filled by under fill material 36. The under fill naterial 36 is typically a low viscosity epoxy-like material.

Figure 5:
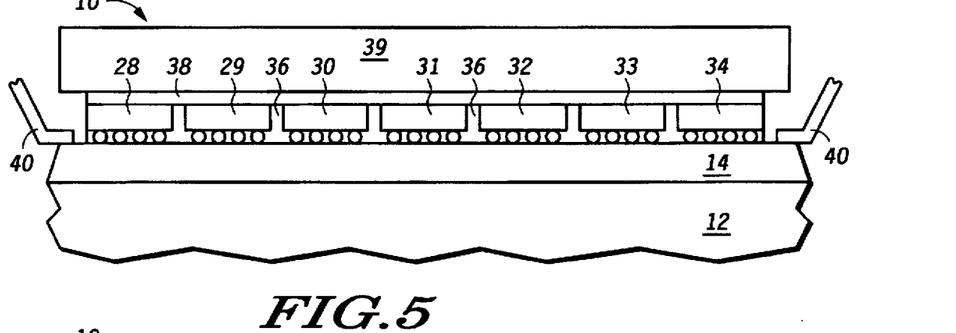

In FIG. 5, conductive leads 40 are attached to exposed conductive contact areas 22 of signal distribution film 14 (see FIG. 2 which shows some example contact areas). Note that contact areas for C4 bump and contact areas for leads may be of substantially different sizes. When product wafer testing is occurring, leads 40 are connected to power supplies and input/output signals from an external tester to allow for test communication from the external tester to the die 28-34 and on to the product wafer 44 (see FIG. 8). Note that leads 40 are illustrated in FIG. 4 as having a bent shape, however, many different types and shaped of leads can be formed in FIG. 5. In summary, leads 40 allow power supply and I/O signals to be supplied to test structure 10.

In FIG. 5, backing support wafer 39 is attached to a back side of die 28-34 providing support, and mechanical stability, and maintaining the relative alignment between all of the components of test structure 10. Standard die attach compounds 38 are used to attach the integrated circuits 28-34 to the wafer 39 in FIG. 4. Once again, the temperature coefficient of expansion of the backside support wafer 39 should be matched to the temperature coefficient of expansion of the integrated circuits 28-34 and the layer 14/mold 12 to maintain electrical contact alignment and mechanical integrity. Since the die 28-34 may come from different wafer batches, different wafers, different fabrication facilities, different wafer sizes, etc., the vertical thickness of the die 28-34 may not be substantially equal. Therefore, a backgrind operation may be needed to get the collective backsides of the die 28-34 substantially planar in order to make a reliable contact between wafer 39 and the die 28-34.

Figure 6:
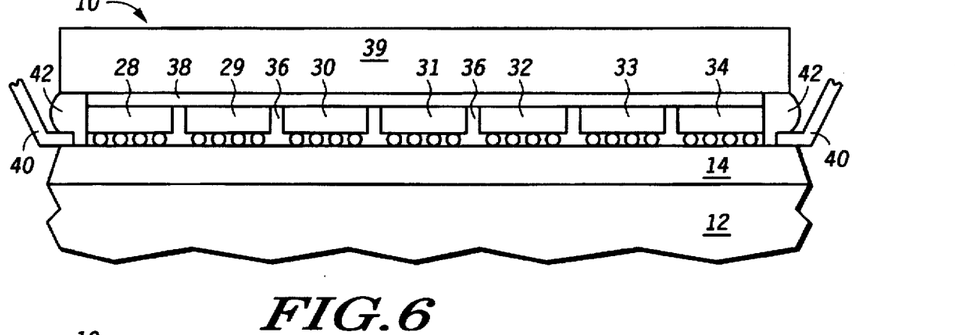

Dielectric layer 42 is then added to the space between backing support wafer 39 and signal distribution film 14, as illustrated in FIG. 6, to mechanically support the conductive leads 40. Dielectric layer 42 is applied around the entire perimeter of the test structure 10. Dielectric layer 42 provides mechanical support to all of test structure 10 and especially supports the leads 40 while simultaneously preventing contamination of die 28-34.

Figure 7:
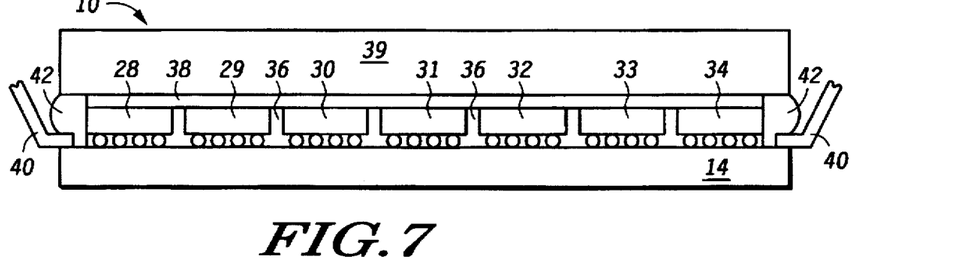

In FIG. 7, the mold silicon wafer 12 is removed from the structure from the structure. Either chemical mechanical polishing (CMP), mechanical grinding, and/or chemical etching is used to remove the mold 12 in order to expose bottom portions of the layers 18 and 16 as illustrated in FIG. 2. Test structure 10 then includes the backing support wafer 39 connected to die 28-34 with die attach 38, along with regions 42, leads 40, and signal distribution layer 14 which have been removed from the mold 12.

FIG. 8 illustrates a test system 50. FIG. 8 illustrates that conductive layer 18 of layer 14 (see FIG. 2) is brought into electrical contact with conductive regions (illustrated as conductive bumps in FIG. 8) of a product wafer 44 which contains product integrated circuits (ICs) which are to be burned-in and/or tested. Test signals and control are communicated from an external tester (not illustrated in FIG. 8), to leads 40, to the die 28-34, through film 14, to the product ICs under test on wafer 44. Therefore, product ICs are manufactured and using the test structure created in FIGS. 1–7.

Figure 9:
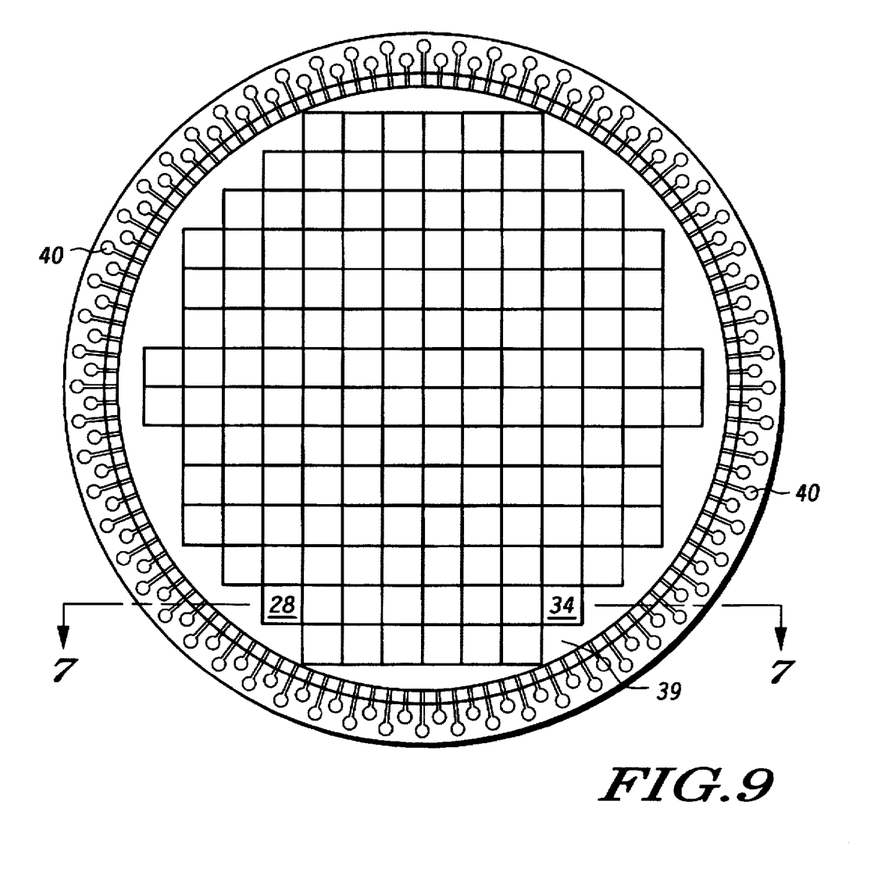
FIG. 9 illustrates, in a top perspective view, the test structure previously illustrated in a cross-sectional manner via FIG. 7.

FIG. 9 illustrates a top view of test structure 10 in accordance with one embodiment of the present invention. Good die 28-34 are representative of all die within the test structure. Leads 40 are shown around the perimeter of the test structure where backing support wafer 39 is placed over the die 28-34. Note that FIG. 9 is a top view of test structure 10 as illustrated in FIG. 7.

Figure 10:
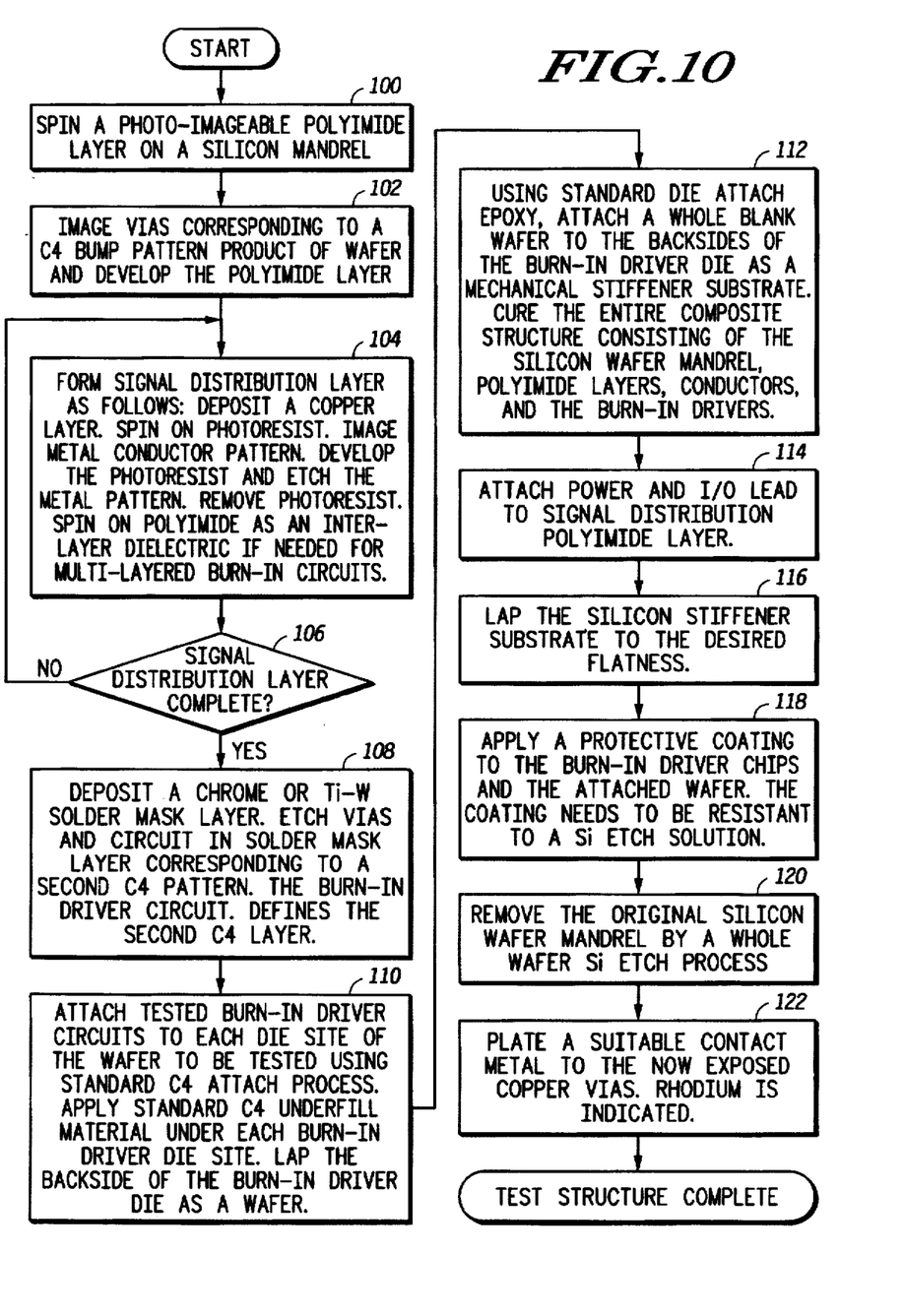
FIG. 10 illustrates, in a flow chart, a method for manufacture of a test structure, in accordance with one embodiment of the present invention, as illustrated in FIGS. 1-7.

FIG. 10 is a flow chart describing the fabrication of test structure 10 of FIGS. 1–7 in accordance with one embodiment of the present invention. Alternate embodiments may include tested good die 28-34 processed by a variety of processes and also may incorporate various wafer sizes. In one embodiment of the present invention both the good die 28-34 and the product wafer 44, which are illustrated in FIG. 8, have conductive contact areas 26 and 46 constructed according to bump technology. Referring to FIG. 10, a process of fabricating the test structure 10 starts with block 100. A polyimide layer 16, capable of photo imaging, is spun on a silicon mold 12. Preferably the silicon mold 12 is a blank silicon wafer of the same size as product wafer 44. Alternate embodiments incorporate various size wafers, however at a minimum, silicon mold 12 is optimally the same size as product wafer 44.

The next step, described in block 102, involves imaging the vias or areas corresponding to the conductive contact areas of metal layer 18. In one embodiment of the present invention, this corresponds to a C4 bump pattern or some subset thereof, defined by the conductive contact areas 46 of product wafer 44 (see FIG. 8).

In the next step 104, a copper layer 18 is deposited to form metal interconnects. Note that other suitable metals may be used in place of copper as discussed herein. Photoresist is then spun on the wafer to lithographically define the first metal pattern. Standard wafer stepper equipment is then used to image an interdielectric metal connectivity pattern. The photoresist is then developed and the metal connectivity pattern etched resulting in metal layer 18 as illustrated in FIG. 2. After this etch step, the photoresist is removed via ashing or a like removal process. Interlevel dielectrics are formed as needed. This is illustrated in FIG. 2 as the formation of dielectric portions 20. Final passivation on top portion of layer 14 is optional as discussed herein.

Step 106 is used to indicate that multi-metal layer films 14 may be desired and that a looping process of steps 104 and 106 can be used to form multi-level rims 14. This iteration may be repeated as many times as necessary, but most processes do not exceed beyond five layers of conductive lines.

Once signal distribution layer 14 is complete, step 108 is performed. In step 108, a solder mask layer is formed on top of metal layer 22 of FIG. 2. This solder mask layer (which is a top portion of layer 22 of FIG. 2) may be a layer of chrome or Ti-W. The chrome or Ti-W is removed from areas above layer 22 to expose copper areas of layer 22. When solder is exposed to the Ti-W or chrome and the exposed copper regions, the solder will adhere to the exposed copper and not substantially adhere to the Ti-W or chrome. In one embodiment of the present invention exposed openings correspond to the C4 bump pattern of the burn-in driver circuits 28-34 which are part of test structure 10.

In step 110, good test die 28-34 are then attached to the film 14. Burn-in driver circuits 28-34 are good die that have been tested and that will be used as test driver circuits during product burn-in operations. Typically, each die is placed in a position that corresponds to a die on the wafer to be burned-in. This would mean a one-to-one relationship between every die in the test structure and every die in the wafer to be burned-in. Alternate embodiments may implement other than a one-to-one relationship, where a number of die 28-34 in test structure 10 may be less than or grater than the number of die on product wafer 44. Note also that die 28-34 may have a different number of conductive contact areas than the corresponding die of product wafer 44 to allow for communication lines which are only between the external tester (not illustrated, but connected to leads 40) and the die 28-34.

Standard C4 under fill material 36, such as an epoxy, is then applied below each of die 28-34. Alternate embodiments may incorporate other under fill materials consistent with the components of test structure 10 and product wafer 44. Other embodiments may incorporate no under fill at all and rely on airgaps as isolation. If necessary an optional step of planarizing or grinding the backs of each of die 28-34 may be performed as discussed herein. This may be necessary when individual die 28-34 are from different processing facilities or are of non-uniform thickness. A planarization process provides uniformity to the tiled array surface formed by die 28-34.

In step 112, standard die attach epoxy 38 is used to attach backing support wafer 39. The die attach 38 acts as a "glue" layer to the mechanical stiffening substrate 39 (also referred to as a backing support wafer 39). The compound test structure 10 is then cured. The composite test structure 10 now includes mold silicon wafer 12, backing support wafer 39, dielectric portion 16, 20 and 24, conductive portion 18 and 22, and die 28-34.

In step 114, leads 40 are attached for power and signal distribution within signal distribution layer 14. Leads 40 are used to supply power and I/O signals to test structure 10. An alternate embodiment of the present invention attaches leads 40 before applying underfill material 36 during block 110. At this point it may be necessary, as in step 116, to planarize backing support wafer 39. This may be necessary when the overall thickness of test structure 10 must be maintained at a certain level.

In step 118, a temporary protective coating is applied to die 28-34 and the attached wafer. The temporary protective coating is applied around all elements of test structure 10 excluding wafer 12. The coating must be resistant to a Si etchant and is intended to protect test structure 10, including leads 40, during the subsequent step of removing Si mold wafer 12.

At block 120 the original mold Si wafer 12 is removed from test structure 10. In one embodiment, this removal is done using a KOH etch process. Alternate etching processes may be used, however, the protective coating must be resistant to whichever etchant is used. Continuing to block 122, a contact metal is plated to the areas of copper that are exposed by the removal of mold Si wafer 12. In the preferred embodiment Rhodium is used. It is desirable to have a textured surface, such as that inherently achieved by electrochemical plating process. At this point test structure 10 is complete.

Test structure 10 will be used during burn-in as illustrated in FIG. 8. Test structure 10 is placed in contact with product wafer 44. Product wafer 44 having conductive contact areas 46. During test and burn-in procedures test structure 10 is in contact with product wafer 44. Referring to FIG. 8, one embodiment of the present invention allows for the total number of conductive contact areas 46, such as deformable metallic bumps, on product wafer 44 to be larger or smaller than the total number of conductive contact areas 26 on the test structure 10.

Figure 11:
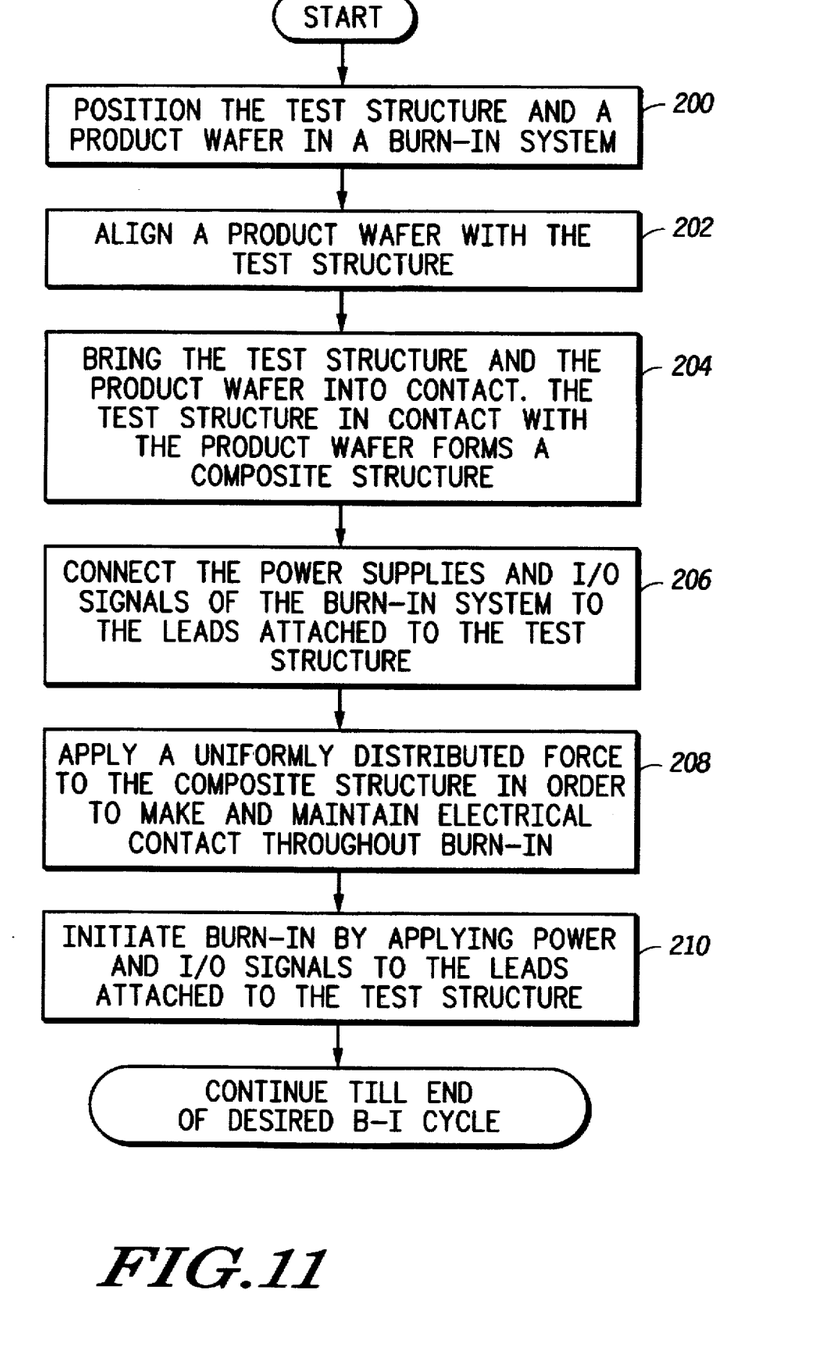
FIG. 11 illustrates, in a flow chart, a method for using the test structure according to one embodiment of the present invention, illustrated in FIG. 7 to test a product wafer in accordance with the present invention.

The process for applying test structure 10 to burn-in testing of product wafer 44 is illustrated in the flow chart of FIG. 11. The test structure 10 and product wafer 44 are positioned in a burn-in system as illustrated in step 200. Continuing to block 202, product wafer 44 is aligned with the test structure 10. Note that alignment does not necessarily indicate a one-to-one correspondence between the conductive contact areas 26 of die 28-34 and conductive contact areas 46 of wafer 44. In step 204 the test structure and product wafer are brought into contact. A composite structure 50 is formed of test structure 10 and product wafer 44.

Continuing to step 206, power supplies and I/O signals applied to the leads 40 of test structure 10. I/O signal stimulus may be used for performing functional, parametric, and various other burn-in tests on wafer 44.

In block 208 a uniformly distributed force is applied to composite grouping 50. The force will make and maintain actual electrical contact between test structure 10 and wafer 44 throughout the test or burn-in procedure. In one embodiment of the present invention a pressurized air system is used to provide the uniformly distributed force. Burn-in is then initiated by applying the power and I/O signals to the leads 40 attached to the test structure 10, as in block 210. The uniformly distributed forces apply throughout the burn-in process. Note that the power and input output signals are applied as needed throughout the test or burn-in procedure.

The present invention allows burn-in and testing of individual integrated circuits on a wafer using test wafer of individual good test die.

Figure 12:
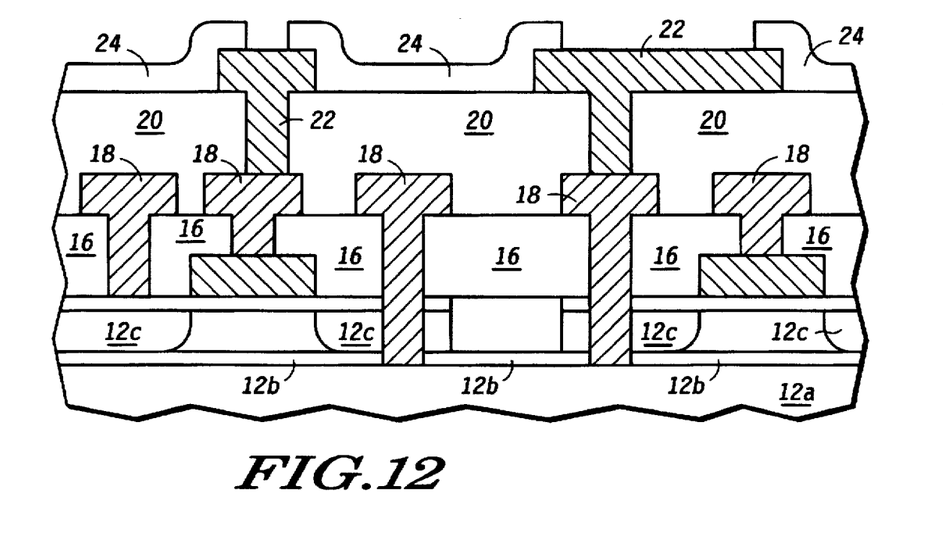
FIG. 12 illustrates, in a cross sectional diagram, another embodiment of FIG. 2 wherein the final device of FIG. 7 will be a multi-chip module (MCM).

FIG. 12 illustrates another embodiment of the thin film 14 previously illustrated in FIG. 2. In one form, the film 14 could be manufactured containing active and passive devices (transistors, memory, CPUs, logic gates, ASICs, etc.) whereby more than just conductive interconnects and dielectric layers comprise the layer 14. FIG. 12 illustrates a silicon-on-insulator (SOI) substrate 12 having a silicon base portion 12a, a dielectric or selective implantation of oxide (SIMOX) layer 12b, and a thin top semiconductive layer 12c. It is important to note that any SOI substrate can be used in FIG. 12 and that FIG. 12 currently illustrates only one type of SOI substrate.

Source and drain electrodes for transistors are formed in layer 12c. as illustrated in FIG. 12. Gate electrode for transistors are formed from metal, amorphous silicon, or polysilicon in FIG. 12. The elements of FIG. 2 are illustrated in FIG. 12 with the same numerical references. The only difference in these layers is that the contacts 18 used to connect to a product wafer or IC package extend through the SOI layers 12c and 12b to a top surface of layer 12a. Polishing or etching can be used to remove the layer 12a and leave behind layers 12b and all layers above 12b. Therefore, the active circuitry of FIG. 12 can be used to provide test circuitry to supplement the testing of the product wafer 44 described herein. In another form, the device of FIG. 7 can be packaged in an IC package with ball bonds and wire bond connections being formed to lead areas 40 and regions 18. In this IC package, the circuitry in FIG. 12 can supplement an IC 28 which resides in the same package, for example. Therefore, FIG. 12 can be used to enhance test circuitry for FIG. 8, or can be used to form a novel multi-chip module (MCM). Note that multiple structures of FIG. 12 can be formed and stacked to form a sandwich with an singulated die so that, for example, one package could have one singulated IC die and six stacked thin film active circuit devices one on top of the other in one package.

While the present invention has been illustrated and described with reference to specific embodiments, further modifications and improvements will occur to those skilled in the art. For example, plurality as used herein is intended to mean any number of elements between two and infinity. Plurality, as used herein, should not be limited to any other specific constant or subrange. It is to be understood, therefore, that this invention is not limited to the particular forms illustrated and that it is intended in the appended claims to cover all modifications that do not depart from the spirit and scope of this invention.

What is claimed is:

1. A method for manufacturing a test structure, the method comprising the steps of:
    providing a base layer having exposed conductive connection regions;
    providing a plurality of segmented integrated circuits wherein the segmented integrated circuits have exposed conductive connection regions;
    coupling the plurality of segmented integrated circuits to the base layer wherein the exposed conductive connection regions of the plurality of segmented integrated circuits are electrically coupled to the exposed conductive connection regions of the base layer;
    forming a stabilizing layer which mechanically strengthens the plurality of segmented integrated circuits which are coupled to the base layer, wherein the stabilizing layer, plurality of segmented integrated circuits, and base layer now form the test structure; and
    using the test structure to stimulate at least one integrated circuit.

2. The method of claim 1 wherein the step of using the test structure further comprises:
    coupling the test structure to a silicon product wafer wherein the silicon wafer contains a plurality of product integrated circuits which have exposed conductive connection regions, the exposed conductive connection regions of the plurality of product integrated circuits being coupled to product wafer conductive members on the base layer whereby the plurality of segmented integrated circuits can control stimulation of the plurality of product integrated circuits.

3. The method of claim 2 wherein the step of coupling the test structure comprises:
    using the plurality of segmented integrated circuits to perform burn-in operations of the plurality of product integrated circuits at a temperature which is elevated above room temperature.

4. The method of claim 2 wherein the product wafer conductive members are located on a first surface of the base layer and the exposed conductive connection regions are located on a second surface of the base layer wherein the first surface is opposite the second surface.

5. The method of claim 1 wherein the step of using the test structure further comprises:
    coupling the base layer to the at least one integrated circuit via conductive bumps.

6. The method of claim 1 wherein the step of forming a stabilizing layer comprises:
    attaching a semiconductor wafer to backside portions of the plurality of segmented integrated circuits where the semiconductor wafer functions as the stabilizing layer.

7. The method of claim 6 wherein the step of attaching the semiconductor wafer comprises:
    attaching the semiconductor wafer to the plurality of segmented integrated circuits using die attach material.

8. The method of claim 1 wherein the base layer is coupled to the plurality of segmented integrated circuits via conductive bumps and wherein the step of forming a stabilizing layer comprises:
    forcing bump underfill material into gaps between the conductive bumps so that the underfill material functions as the stabilizing material.

9. The method of claim 1 wherein the base layer is coupled to the plurality of segmented integrated circuits via conductive bumps and wherein the step of forming a stabilizing layer comprises:
    applying fill material into gaps located between segmented integrated circuits which are adjacent to each other after being attached to the base layer, the fill material functioning as the stabilizing material.

10. The method of claim 1 wherein the step of placing the plurality of segmented integrated circuits comprises:
    testing each segmented integrated circuit within the plurality of segmented integrated circuits to ensure that each segmented integrated circuit coupled to the base layer is functional before coupling to the base layer takes place.

11. The method of claim 1 further comprising:
    attaching conductive leads to the base layer wherein the conductive leads are adapted to be contacted to a external tester whereby the external tester provides electrical signals to the plurality of segmented integrated circuits through the conductive leads.

12. The method of claim 11 further comprising:
    forming a lead stabilizing material in contact with the conductive leads to mechanically stabilize the conductive leads.

13. The method of claim 12 wherein the step of forming the lead stabilizing material comprises:

forming the lead stabilizing material as a region of epoxy.

14. The method of claim 1 wherein the step of placing the plurality of segmented integrated circuits comprises:

using conductive bumps to make electrical contact between the placing the plurality of segmented integrated circuits and the base layer.

15. The method of claim 1 wherein the step of providing a base layer comprises:

providing the base layer as a thin film where the thin film contains at least one conductive layer encapsulated by a dielectric material, the at least one conductive layer being used to electrically couple the plurality of segmented integrated circuits to the at least one integrated circuit.

16. The method of claim 15 wherein the step of providing the base layer as a thin film comprises:

forming the thin film on top of a silicon wafer mold.

17. The method of claim 15 wherein the step of providing the base layer as a thin film comprises:

forming the thin film on top of a silicon wafer mold wherein the silicon wafer mold is sacrificial and is removed from the base layer before the step of using the test structure to test at least one integrated circuit is performed.

18. The method of claim 17 wherein the silicon wafer mold is at least partially removed by a polishing process.

19. The method of claim 17 wherein the silicon wafer mold is at least partially removed by a chemical etching process.

20. The method of claim 15 wherein the step of providing the base layer as a thin film comprises:

forming the base layer by depositing and selectively etching a plurality of conductive layers and a plurality of dielectric layers using lithographic processing.

21. The method of claim 1 wherein the stabilizing layer is a wafer coupled to backside of the plurality of segmented integrated circuits and wherein the stabilizing layer, plurality of segmented integrated circuits, and the at least one integrated circuit are formed from materials so that coefficients of thermal expansion of the within the stabilizing layer, plurality of segmented integrated circuits, and the at least one integrated circuit are substantially equivalent.

22. The method of claim 1 further comprising:

performing burn-in operations on the test structure before using the test structure in the step of using the test structure to stimulate at least one integrated circuit.

23. A method for testing product integrated circuits using a test structure:

providing a test structure wherein the test structure is a semiconductor wafer coupled to a plurality of segmented test integrated circuits where the plurality of segmented test integrated circuits are coupled to a signal distribution film;

placing a product wafer containing product integrated circuits in contact with the signal distribution film;

stimulating the product integrated circuits via electrical signals provided from the plurality of segmented test integrated circuits to the product integrated circuits via the signal distribution film;

identifying which product integrated circuits are failing product integration circuits in response to the step of stimulating; and dicing and packaging for use the product integrated circuits which are not failing product integrated circuits.

24. A method for manufacturing a test structure, the method comprising the steps of:

providing a silicon mold;

forming a dielectric layer on the silicon mold;

forming product wafer contact openings in the first dielectric layer;

forming at least one conductive layer of material overlying the first dielectric layer, the at least one conductive layer forming product wafer contact areas through the product wafer contact openings;

forming additional dielectric layers as are needed to isolate portions of the at least one conductive layer of material;

defining top portions of the at least one conductive layer of material as test structure contact areas;

providing segmented test integrated circuits which have a top layer of conductive bumps and a backside;

attaching segmented test integrated circuits to the test structure contact areas via the conductive bumps of the segmented test integrated circuits;

attaching a support wafer to the backside of each of the segmented test integrated circuits;

attaching conductive leads to conductive lead areas of the at least one conductive layer of material; and removing the silicon mold to expose the product wafer contact areas so that the segmented test integrated circuits can communicate electrical signals through the at least one conductive layer of material to the product wafer contact areas.

25. The method of claim 24 further comprising:

attaching conductive contacts of a product wafer to the product wafer contact areas; and testing the product wafer by communicating electrical signals from the segmented test integrated circuits through the at least one conductive layer of material to the product wafer contact areas.

26. The method of claim 25 wherein the step of attaching conductive contacts of a product wafer comprises:

attaching conductive contacts of a product wafer to the product wafer contact areas wherein the conductive contacts of the product wafer are conductive bumps.

27. The method of claim 24 wherein the step of attaching conductive leads comprises:

forming a mechanical support material in contact with the conductive leads after the conductive leads have been coupled to the at least one conductive layer of material.

28. The method of claim 24 wherein the step of attaching segmented test integrated circuits comprises:

applying fill material to fill gaps between the conductive bumps of the segmented test integrated circuits.

29. The method of claim 24 wherein the step of attaching segmented test integrated circuits comprises:

applying fill material to fill gaps between the conductive bumps of the segmented test integrated circuits.

30. The method of claim 24 wherein the step of forming a dielectric layer comprises:

forming the dielectric layer as a polyimide layer.

31. A method for forming a multi-chip module, the method comprising the steps of:

providing a base substrate;

forming transistors and conductive interconnects on top of the substrate the conductive interconnects having top-level contact areas;

contacting conductive members of a singulated integrated circuit to the top-level contact areas so that circuitry on the integrated circuit can electrically communicate with the transistors;

removing a portion of the base substrate to form a remaining base substrate from the base substrate; and packaging the remaining base substrate, transistors, and singulated integrated circuit in an integrated circuit package which contains conductors that connects to one or more of the singulated integrated circuit or the transistors.

32. The method of claim 31 wherein the step of contacting conductive members comprises:

forming the conductive members as conductive bumps.

33. The method of claim 31 wherein the step of providing a base substrate comprises:

providing the base substrate as a silicon in insulator (SOI) substrate.

34. The method of claim 33 wherein the step of providing a base substrate comprises:

providing the base substrate as a silicon in insulator (SOI) substrate having a top semiconductive region used to form the transistors, a middle dielectric layer, and a bottom base layer underlying the middle dielectric layer.

35. The method of claim 34 wherein the step of removing comprises:

substantially removing the bottom base layer.

36. The method of claim 34 wherein the step of forming transistors and conductive interconnects comprises:

forming conductive interconnects through the top semiconductive region and the middle dielectric layer wherein these conductive interconnects contact at least one of the transistors.

37. The method of claim 31 wherein the step of contacting conductive members of a singulated integrated circuit comprises:

testing the singulated integrated circuit die before the step of contacting.

* * * * *